US012254621B2

(12) United States Patent
Kim et al.

(10) Patent No.: US 12,254,621 B2
(45) Date of Patent: Mar. 18, 2025

(54) METHOD, ELECTRONIC DEVICE AND OPERATING METHOD OF ELECTRONIC DEVICE AND MANUFACTURE OF SEMICONDUCTOR DEVICE

(71) Applicant: Samsung Electronics Co., Ltd., Suwon-si (KR)

(72) Inventors: Do-Nyun Kim, Seoul (KR); Min-Cheol Kang, Hwaseong-si (KR); Kihyun Kim, Seongnam-si (KR); Jaehoon Kim, Seoul (KR); Jaekyung Lim, Seoul (KR)

(73) Assignees: Samsung Electronics Co., Ltd., Suwon-si (KR); Seoul National University R&DB Foundation, Seoul (KR)

( * ) Notice: Subject to any disclaimer, the term of this patent is extended or adjusted under 35 U.S.C. 154(b) by 403 days.

(21) Appl. No.: 17/856,130

(22) Filed: Jul. 1, 2022

(65) Prior Publication Data

US 2023/0069493 A1 Mar. 2, 2023

(30) Foreign Application Priority Data

Aug. 24, 2021 (KR) .......... 10-2021-0111863

(51) Int. Cl.
*G06K 9/00* (2022.01)
*G01N 21/95* (2006.01)
*G06T 7/00* (2017.01)
*H01L 21/66* (2006.01)

(52) U.S. Cl.
CPC .......... *G06T 7/001* (2013.01); *G01N 21/9505* (2013.01); *H01L 22/12* (2013.01); *G06T 2207/10061* (2013.01); *G06T 2207/20081* (2013.01); *G06T 2207/20084* (2013.01); *G06T 2207/30148* (2013.01)

(58) Field of Classification Search
CPC ............ G06K 9/00; G06F 18/214; G06T 7/00
USPC ......... 382/100, 103.106, 108, 141–148, 152, 382/156, 162, 168, 173, 181, 193–194, 382/199, 209–212, 224, 254, 274–276, 382/286–291, 305; 438/7, 12
See application file for complete search history.

(56) References Cited

U.S. PATENT DOCUMENTS

| 8,526,710 | B2 * | 9/2013 | Nakagaki | G06T 7/0006 382/149 |
| 10,672,588 | B1 * | 6/2020 | Pathangi | G06T 7/0004 |
| 10,692,203 | B2 * | 6/2020 | Kong | G06N 5/01 |
| 10,789,703 | B2 | 9/2020 | Lu et al. | |
| 2019/0303717 | A1 * | 10/2019 | Bhaskar | G06F 18/214 |
| 2020/0034511 | A1 * | 1/2020 | Dutta | G06F 30/398 |
| 2020/0334800 | A1 | 10/2020 | Chou et al. | |
| 2021/0026338 | A1 | 1/2021 | Yati et al. | |

(Continued)

*Primary Examiner* — Seyed H Azarian
(74) *Attorney, Agent, or Firm* — Wolf, Greenfield & Sacks, P.C.

(57) ABSTRACT

Disclosed is an operating method of an electronic device for manufacture of a semiconductor device. The method includes receiving, at the electronic device, a computer-aided design (CAD) image for a lithography process of the semiconductor device, and generating, at the electronic device, a first scanning electron microscope (SEM) image and a first segment (SEG) image from the CAD image by using a machine learning-based module, and the first SEG image includes information about a location of a defect.

20 Claims, 10 Drawing Sheets

(56) References Cited

U.S. PATENT DOCUMENTS

2021/0027984 A1   1/2021   Chou et al.
2021/0042908 A1   2/2021   Liang et al.
2022/0254000 A1*  8/2022   Shkalim .............. G03F 7/70666

* cited by examiner

SEG

METHOD, ELECTRONIC DEVICE AND OPERATING METHOD OF ELECTRONIC DEVICE AND MANUFACTURE OF SEMICONDUCTOR DEVICE

CROSS-REFERENCE TO RELATED APPLICATIONS

This application claims priority under 35 U.S.C. § 119 to Korean Patent Application No. 10-2021-0111863 filed on Aug. 24, 2021, in the Korean Intellectual Property Office, the disclosures of which are incorporated by reference herein in their entireties.

BACKGROUND

Some example embodiments described herein relate to an electronic device, and more particularly, relate to a method of a machine learning-based module for predicting a defect of a semiconductor device with regard to manufacture/fabrication of a semiconductor device, an electronic device driving the machine learning-based module, and/or an operating method of the electronic device.

A semiconductor device is manufactured through various processes. As a technology for designing a semiconductor device develops, the number of processes for manufacturing the semiconductor device may increase, and the complexity of each process may increase. As the number of processes and/or the complexity increase, various defects may occur or may be more prone to occur and/or have a higher impact from occurring in the process of manufacturing semiconductor devices.

A semiconductor defect may be first detected, so as to seize and correct a cause of the semiconductor defect. One of methods of detecting a semiconductor defect includes a visual method. According to the visual method, a semiconductor defect is classified based on images of semiconductor devices. However, the visual method requires/uses a long time and/or a skilled person. Alternatively or additionally, a defect that is not detected may exist depending on the experience and/or tendency of the skilled person.

SUMMARY

Some example embodiments provide a method of a machine learning-based module/circuit for predicting a defect of a semiconductor device with regard to manufacture of a semiconductor device, an electronic device driving the machine learning-based module, and/or an operating method of the electronic device.

According to some example embodiments, an operating method of an electronic device for manufacture of a semiconductor device includes receiving, at the electronic device, a computer-aided design (CAD) image for a lithography process of the semiconductor device, and generating, at the electronic device, a first scanning electron microscope (SEM) image and a first segment (SEG) image that are generated from the CAD image by using a machine learning-based circuit. The first SEG image includes information about a location of a defect.

According to some example embodiments, an electronic device includes a memory, and a processor configured to drive a machine learning-based circuit by using the memory. In response to executing the machine learning-based circuit, the processor is configured to receive a CAD image for a lithography process of a semiconductor device, and to generate a first SEM image and a first SEG image, the first SEM image and the first SEG image generated from the CAD image by using the machine learning-based module. The first SEG image may include information about a location of a defect.

According to some example embodiments, a method of manufacturing a semiconductor device by using at least one electronic device includes receiving, at the at least one electronic device, a CAD image for a lithography process of the semiconductor device, generating, at the at least one electronic device, both a SEM image and a SEG image from the CAD image by using a machine learning-based module, and performing, a follow-up operation based on the SEM image and the SEG image. The SEG image includes information about a location of a defect.

BRIEF DESCRIPTION OF THE FIGURES

The above and other objects and features of the present disclosure will become apparent by describing in detail embodiments thereof with reference to the accompanying drawings.

DETAILED DESCRIPTION

Below, various example embodiments of may be described in detail and clearly to such an extent that an ordinary one in the art may easily implement the variously describe example embodiments.

Figure 1:
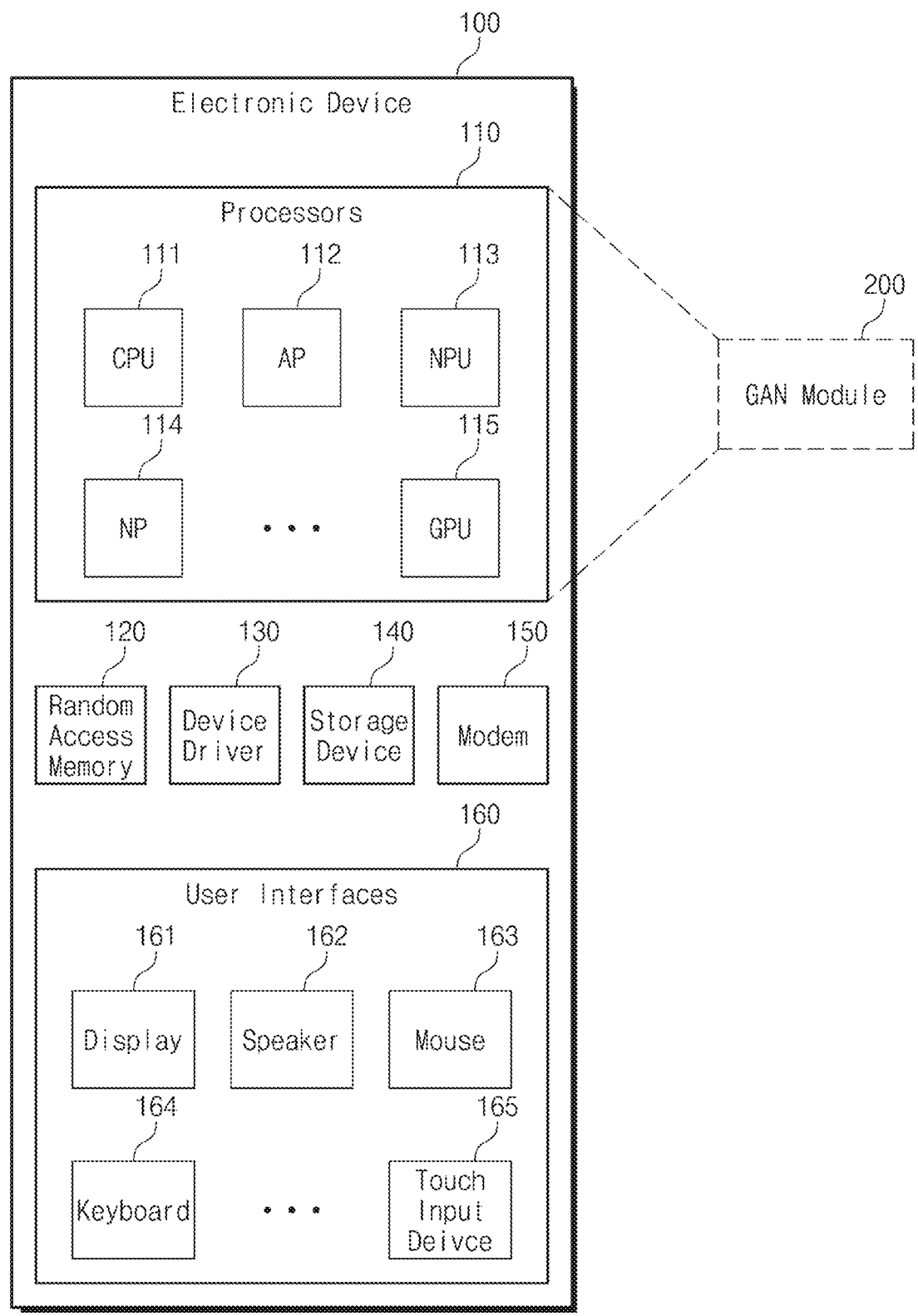
FIG. 1 is a block diagram illustrating an electronic device according to some example embodiments.

FIG. 1 is a block diagram illustrating an electronic device 100 according to some example embodiments. Referring to FIG. 1, the electronic device 100 may include processors 110, a random access memory 120, a device driver 130, a storage device 140, a modem 150, and user interfaces 160.

The processors 110 may include, for example, at least one general-purpose processor such as a central processing unit (CPU) 111 or an application processor (AP) 112. Also, the processors 110 may further include at least one special-purpose processor such as a neural processing unit (NPU) 113, a neuromorphic processor 114, or a graphics processing unit (GPU) 115. The processors 110 may include two or more homogeneous processors. Any or all of the processors 110 may be able to communicate with any or all of the other processors 110; example embodiments are not limited thereto.

At least one of the processors 110 may be used to train a generative adversarial network (GAN) circuit/module 200. The GAN module 200 may be or may include another processor, such as another CPU; however, example embodiments are not limited thereto. At least one of the processors 110 may train the GAN module 200 based on various data or information.

At least one (or at least another) of the processors 110 may execute the GAN module 200. The GAN module 200 may predict a defect of a semiconductor device, based on machine learning and/or on deep learning. For example, the GAN module 200 may be implemented in the form of commands (and/or codes) that are executed by at least one of the processors 110. In this case, the at least one processor may load the commands (or codes) of the GAN module 200 onto the random access memory 120.

Alternatively or additionally, at least one (or at least another) processor of the processors 110 may be manufactured to implement the GAN module 200. For example, the at least one processor may be a dedicated processor that is implemented in hardware based on the GAN module 200 generated by the learning of the GAN module 200.

Alternatively or additionally, the at least one processor (or at least another processor) of the processors 110 may be manufactured to implement various machine learning and/or deep learning modules. The at least one processor 110 may implement the GAN module 200 by receiving information (e.g., commands and/or codes) corresponding to the GAN module 200.

The random access memory 120 may be used as a working memory of the processors 110 and may be used as a main memory and/or a system memory of the electronic device 100. The random access memory 120 may include a volatile memory such as a dynamic random access memory and/or a static random access memory, and/or a nonvolatile memory such as one or more of a phase-change random access memory, a ferroelectric random access memory, a magnetic random access memory, or a resistive random access memory.

The device driver 130 may control the following peripheral devices depending on a request of one or more of the processors 110: the storage device 140, the modem 150, and the user interfaces 160. The storage device 140 may include a stationary storage device such as a hard disk drive or a solid state drive, and/or a removable storage device such as one or more of an external hard disk drive, an external solid state drive, or a removable memory card.

The modem 150 may provide remote communication with an external device. The modem 150 may perform wired and/or wireless communication with the external device. The modem 150 may communicate with the external device based on at least one of various communication schemes such as Ethernet, wireless-fidelity (Wi-Fi), long term evolution (LTE), and 5G mobile communication.

The user interfaces 160 may receive information from a user and may provide information to the user. The user interfaces 160 may include at least one user output interface such as a display 161 or a speaker 162, and at least one user input interface such as a mouse 163, a keyboard 164, or a touch input device 165.

The commands (and/or codes) of the GAN module 200 may be received through the modem 150 and may be stored in the storage device 140. The commands (and/or codes) of the GAN module 200 may be stored in a removable storage device, and the removable storage device may be connected with the electronic device 100. The commands (and/or codes) of the GAN module 200 may be loaded and executed onto the random access memory 120 from the storage device 140. Any or all of the random access memory 120, the device driver 130, the storage device 1540, the modem 150, or any or all of the user interfaces 160 may be able to communicate with any or all of the others, and/or with the GAN module 20.

In some example embodiments, the GAN module 200 may be implemented based on a conditional GAN and/or a pixe2pix.

Figure 2:
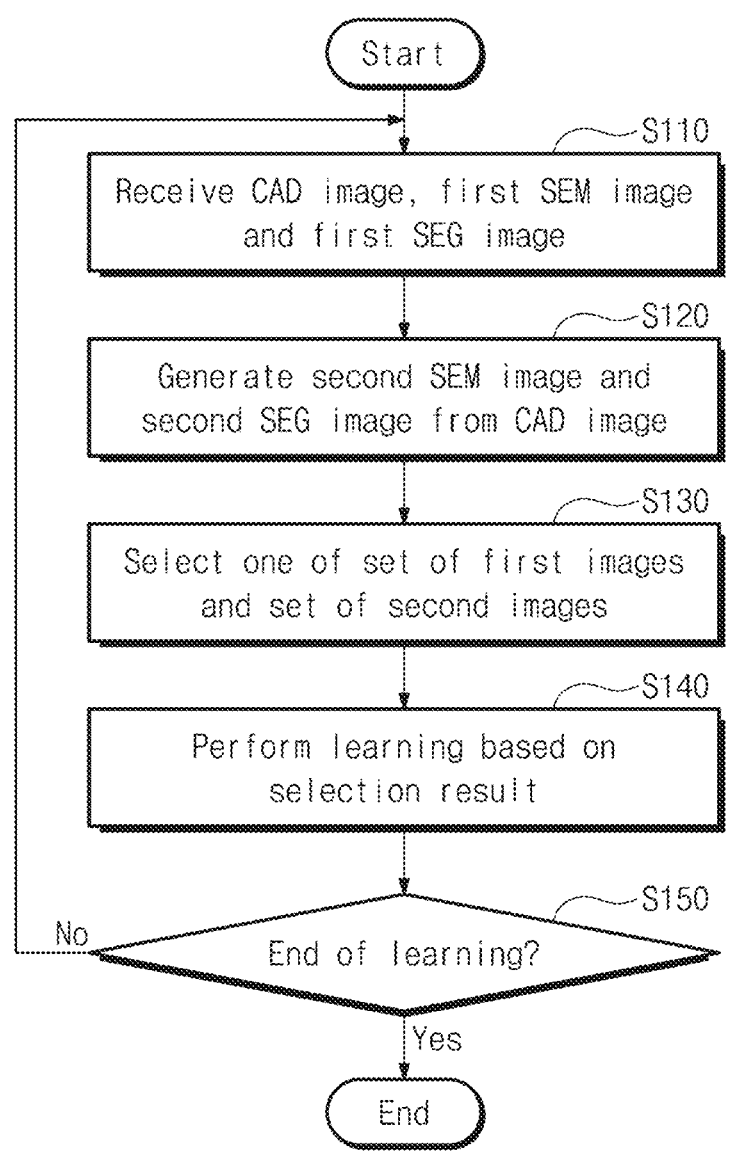
FIG. 2 illustrates an example of an operating method of an electronic device of FIG. 1.

FIG. 2 illustrates an example of an operating method of the electronic device 100 of FIG. 1. Referring to FIGS. 1 and 2, in operation S110, the electronic device 100, for example, the GAN module 200 may receive a computer-aided design (CAD) image, a first scanning electron microscope (SEM) image, and a first segment (SEG) image for a semiconductor process of a semiconductor device.

For example, the first SEM image may be obtained from an actually manufactured, or at least partially actually manufactured semiconductor device, that was at least partially manufactured based on the CAD image. The first SEG image may also be obtained from the at least partially manufactured semiconductor device, and may be obtained based on the CAD image. The first SEG image may include information about whether a defect is present in the first SEM image, and information about a location of and/or size of the defect. For example, the first SEG image may be an image that is obtained by performing defect-targeted segmentation on the first SEM image.

In operation S120, the electronic device 100, for example, the GAN module 200 may generate a second SEM image and a second SEG image from the CAD image. The second SEM image may be obtained from the CAD image as the GAN module 200 performs inference based on machine learning (e.g., generative adversarial network). The second SEG image may also be obtained from the CAD image as the GAN module 200 performs the inference based on machine learning (e.g., GAN).

In operation S130, the electronic device 100, for example, the GAN module 200 may select/identify, with a "true" label, one of a set of first images (e.g., the CAD image, the first SEM image, and the first SEG image) and a set of second images (e.g., the CAD image, the second SEM image, and the second SEG image). The electronic device 100 may select/identify the other set thereof with a "false" label.

In operation S140, the electronic device 100, for example, the GAN module 200 or a processor or module training the GAN module 200 may train (e.g., perform machine learning on) the GAN module 200 based on a selection result. For example, the electronic device 100 may train the GAN module 200 such that each of the probability that the GAN module 200 selects the set of first images with a "true" label, and selects the set of second images with a "false" label and the probability that the GAN module 200 selects/identifies the set of first images with a "false" label and selects/identifies the set of second images with a "true" label converges to 50%.

As operation S110 to operation S140 are performed, learning may be completed once. That learning is performed once may correspond to that one epoch is performed.

In operation S150, the electronic device 100 may determine whether the learning of the GAN module 200 ends. When the learning of the GAN module 200 ends, the electronic device 100 may terminate the process associated with the learning of the GAN module 200. When the learning of the GAN module 200 does not end, the electronic device 100 may again perform operation S110 to operation S150.

Figure 3:
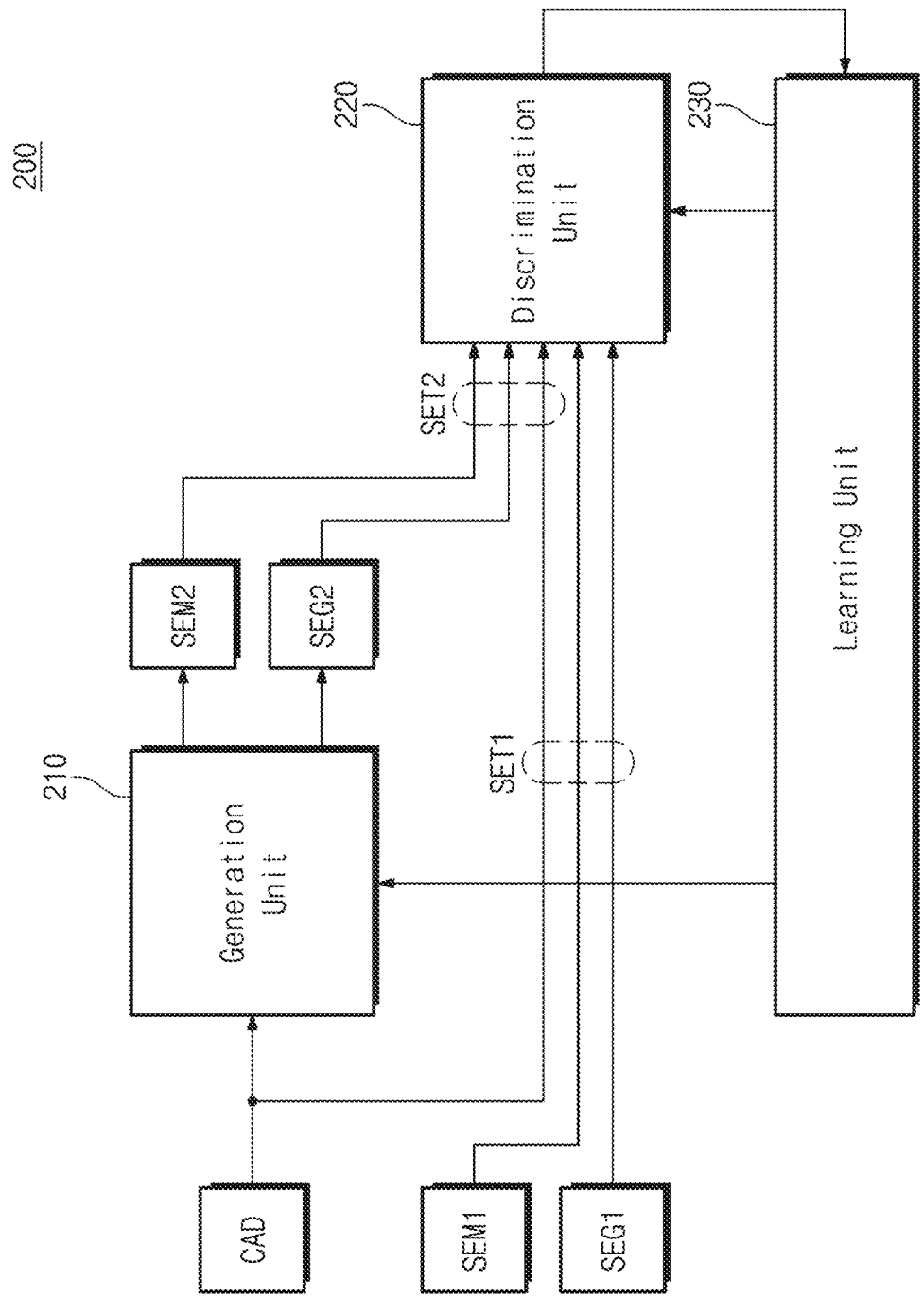
FIG. 3 illustrates an example of a GAN module/GAN circuit.

FIG. 3 illustrates an example of the GAN circuit/GAN module 200. Referring to FIGS. 1, 2, and 3, the GAN module 200 may include a generation unit 210, a discrimination unit 220, and a learning unit 230. The generation unit 210 may correspond to a generator in the GAN. The generation unit 210 may receive a CAD image CAD, and, from the CAD image CAD, may generate a second SEM image SEM2 and a second SEG image SEG2. For example, the generation unit 210 may generate the second SEM image SEM2 and/or the second SEG image SEG2 based on the CAD image CAD by adding random noise to the CAD image CAD or by using the CAD image as the random noise; however, example embodiments are not limited thereto.

The discrimination unit 220 may correspond to a discriminator in the GAN. The discrimination unit 220 may receive the CAD image CAD, a first SEM image SEM1, a first SEG image SEG1, the second SEM image SEM2, and the second SEG image SEG2. The discrimination unit 220 may discriminate one of a first set SET1 including the CAD image CAD, the first SEM image SEM1, and the first SEG image SEG1 and a second set SET2 including the CAD image CAD, the second SEM image SEM2, and the second SEG image SEG2 as/with a "true" label and may discriminate the other thereof as a/with "false" label.

The learning unit 230 may receive a result of the discrimination (and/or selection) from the discrimination unit 220. The learning unit 230 may train the generation unit 210 and/or the discrimination unit 220 based on the discrimination (or selection) result.

In some example embodiments, the learning unit 230 may receive at least one of the CAD image CAD, the first SEM image SEM1, the first SEG image SEG1, the second SEM image SEM2, and the second SEG image SEG2, and may train the generation unit 210 and the discrimination unit 220 by using the at least one image thus received.

Figure 4:
FIG. 4 illustrates an example of a CAD image.

FIG. 4 illustrates an example of the CAD image CAD. Referring to FIG. 4, the CAD image CAD may be a design image of patterns of a photomask that is used in a photolithography process of a semiconductor manufacturing process. The semiconductor manufacturing/fabrication process may be targeted to implement patterns corresponding to the CAD image CAD on a semiconductor wafer.

The CAD image CAD may be or may include a portion of shapes such as polygons, such as a portion of bars/squares/etc. that are transcribed onto the photomask. The CAD image CAD may be in an appropriate format, and/or may be generated from another format, e.g. from a Graphics Design System II (GDSII) format; however, example embodiments are not limited thereto. The CAD image CAD may be a final image that is generated after an optical proximity correction (OPC) process and/or a dummy fill process; alternatively or additionally the CAD image may be an as-designed image prior to any OPC process and/or dummy fill process. The CAD image CAD may have patterns corresponding to contours, such as splines, in addition to or alternatively to patterns corresponding to polygons. The CAD image CAD may be positive, having openings corresponding to locations in which a pattern will be formed, or may be negative, having openings corresponding to locations in which a pattern will not be formed. The CAD image CAD may be monotonic, e.g. black-and-white, or may be multi-colored; example embodiments are not limited thereto.

Figure 5:
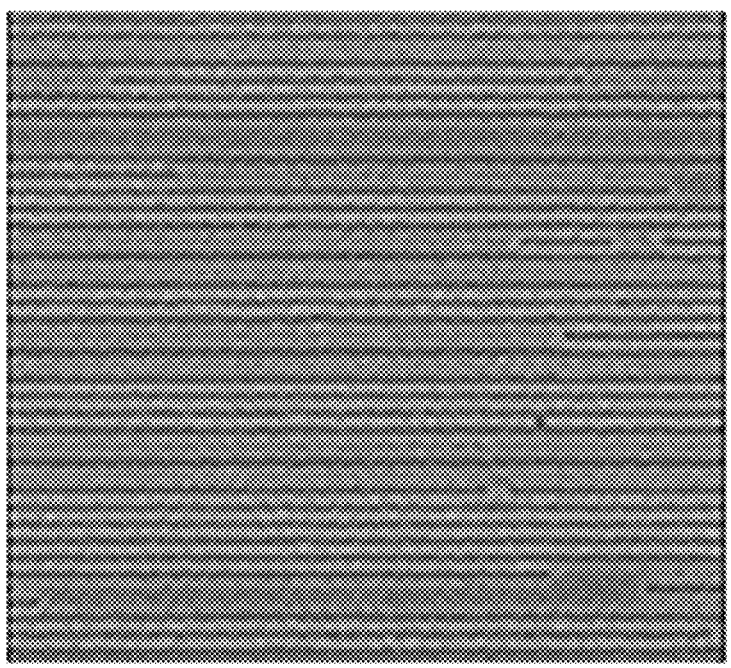
FIG. 5 illustrates an example of a SEM image.

FIG. 5 illustrates an example of the SEM image SEM. Referring to FIGS. 3 and 5, the SEM image SEM may correspond to the first SEM image SEM1 or the second SEM image SEM2. For example, the first SEM image SEM1 may be an image that is obtained or directly obtained from a semiconductor device actually being fabricated, and may be generated by using the CAD image CAD (refer to FIG. 4), for example by using a scanning electron microscope (SEM) and/or an optical microscope. The second SEM image SEM2 may be an image of the semiconductor device that the GAN module 200 infers from the CAD image CAD, and may not be obtained or may not be directly obtained from a semiconductor device that is actually fabricated.

Figure 6:
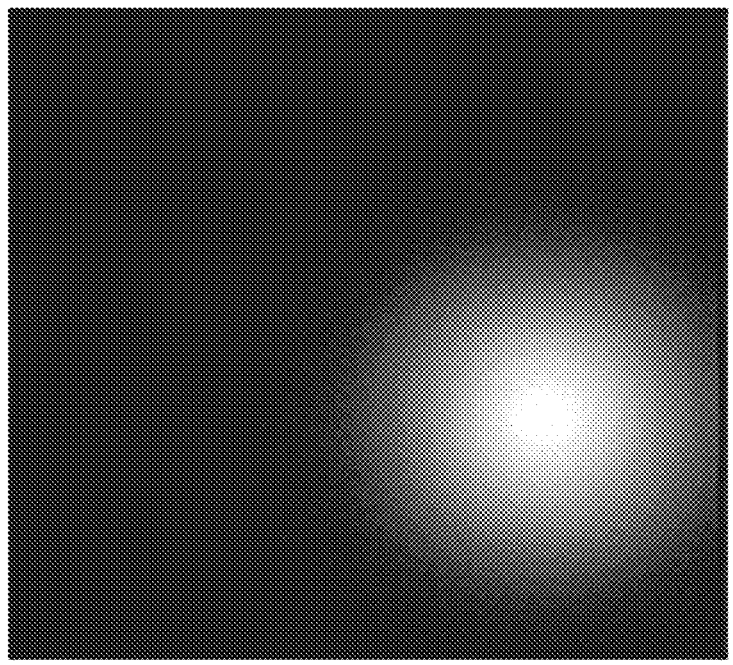
FIG. 6 illustrates an example of a SEG image.

FIG. 6 illustrates an example of the SEG image SEG. Referring to FIGS. 3 and 6, the SEG image SEG may correspond to the first SEG image SEG1 or the second SEG image SEG2. For example, the first SEG image SEG1 may show location information (e.g., probability information of a location) of a defect present (e.g., if present) on the first SEM image SEM1 corresponding thereto, based for example on Gaussian blurring.

When a defect is absent from the first SEM image SEM1, the first SEG image SEG1 may be marked by/with an identifier such as a blank. When two or more defects are present on the first SEM image SEM1, the first SEG image SEG1 may include two or more Gaussian blurring points.

For example, the second SEG image SEG2 may show location information (e.g., probability information of a location) of a defect present (e.g., if present) on the second SEM image SEM2 corresponding thereto, based on Gaussian blurring.

When a defect is absent from the second SEM image SEM2, the second SEG image SEG2 may be marked by an identifier such as a blank. When two or more defects are present on the second SEM image SEM2, the second SEG image SEG2 may include two or more Gaussian blurring points.

In some example embodiments, the electronic device 100 and/or the GAN module 200 may perform a pre-processing operation of mixing the CAD image CAD of FIG. 4, the SEM image SEM of FIG. 5, and the SEG image SEG of FIG. 6 and generating a mixed image.

For example, the pre-processing operation may include blending (e.g., alpha blending) the CAD image CAD, the SEM image SEM, and the SEG image SEG. Alpha values that are respectively applied to the CAD image CAD, the SEM image SEM, and the SEG image SEG may be the same as or different from each other. The alpha values may be set by the electronic device 100 or the GAN module 200, and/or may be adaptively determined.

The pre-processing operation may include generating a 3-channel image including the CAD image CAD, the SEM image SEM, and the SEG image SEG individually. For example, when each of the CAD image CAD, the SEM image SEM, and the SEG image SEG includes channels of two or more colors, the number of channels of the mixed image may be greater than three colors.

The pre-processing operation may include generating one image by arranging the CAD image CAD, the SEM image SEM, and the SEG image SEG in the shape of cascade.

The description is given with reference to FIG. 6 as the electronic device 100 or the GAN module 200 displays a location of a defect on the SEG image SEG in the shape of Gaussian blurring. Alternatively or additionally, the electronic device 100 or the GAN module 200 may display a location of a defect on the SEG image SEG in any other shape. For example, the electronic device 100 and/or the GAN module 200 may display a location of a defect on the SEG image SEG in various shapes such as one or more of pixels corresponding to the defect, a circle, and a quadrangle.

Alternatively or additionally, the electronic device 100 and/or the GAN module 200 may use two or more SEG images SEG with regard to one SEM image SEM. For example, the electronic device 100 or the GAN module 200 may show, on one SEG image SEG, a location of a defect of the corresponding SEM image SEM in the shape of Gaussian blurring, and may show, on another SEG image SEG, a location of a defect of the corresponding SEM image SEM in the shape of pixels, not Gaussian blurring.

For example, the electronic device 100 or the GAN module 200 may generate a final SEG image SEG of the corresponding SEM image SEM by blending two or more SEG images SEG in which a location of a defect of the corresponding SEM image SEM is shown in different shapes. The electronic device 100 or the GAN module 200 may perform the functions described with reference to FIGS. 1, 2, and 3 by using the final SEG image SEG.

For example, the electronic device 100 or the GAN module 200 may generate a first final SEG image SEG1 from two or more SEG images SEG. The electronic device 100 or the GAN module 200 may generate two or more SEG images SEG and may generate a second final SEG image SEG2 by blending two or more SEG images SEG.

Figure 7:
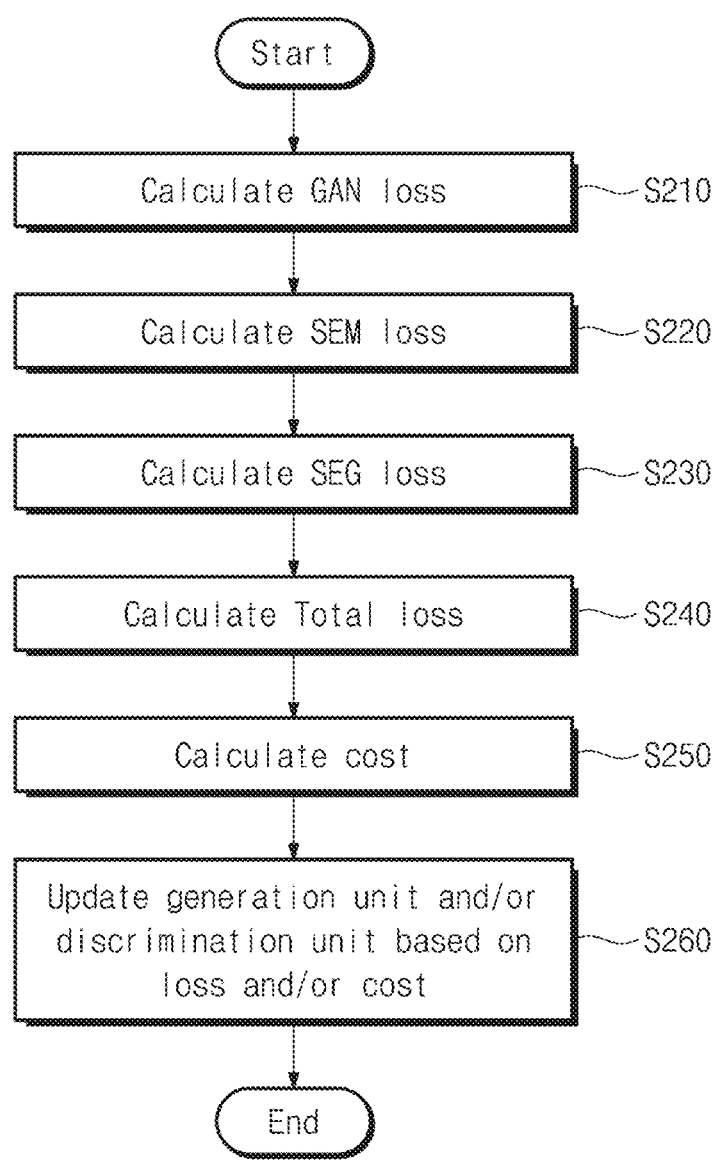
FIG. 7 illustrates an example of a process in which an electronic device or a GAN module performs learning.

FIG. 7 illustrates an example of a process (refer to operation S140 of FIG. 2) in which the electronic device 100 or the GAN module 200 performs learning. Referring again to FIGS. 1, 2, 3, and 7, in operation S210, the electronic device 100 and/or the GAN module 200 may calculate a GAN loss $Loss_{GAN}$. The GAN loss may be calculated by Equation 1 below.

$$Loss_{GAN}=E[\log D(CAD,SEM1,SEG1)]+E[1-\log D(CAD,G_1(CAD),G_2(CAD))] \quad \text{[Equation 1]}$$

In Equation 1, a function $G_1(CAD)$ may correspond to a part of the function of the generation unit 210, and may correspond to a function of generating the second SEM image SEM2 from the CAD image CAD. For example, the function $G_1(CAD)$ may be replaced with the second SEM image SEM2. A function $G_2(CAD)$ may correspond to a part of the function of the generation unit 210, and may correspond to a function of generating the second SEG image SEG2 from the CAD image CAD. For example, the function $G_2(CAD)$ may be replaced with the second SEG image SEG2.

A function D(CAD, SEM1, SEG1) may correspond to a part of the function of the discrimination unit 220, and may correspond to the probability that the first set SET1 of images including the CAD image CAD, the first SEM image SEM1, and the first SEG image SEG1 is discriminated as "true". A function D(CAD, SEM2, SEG2) may correspond to a part of the function of the discrimination unit 220, and may correspond to the probability that the second set SET2 of images including the CAD image CAD, the second SEM image SEM2, and the second SEG image SEG2 is discriminated as "true".

A function E[log D(CAD, SEM1, SEG1)] may indicate a value that is estimated with respect to all the images of the first set SET1. A function E[1-log D(CAD, SEM2, SEG2)] may indicate a value that is estimated with respect to all the images of the second set SET2.

In operation S220, the electronic device 100 or the GAN module 200 may calculate a SEM loss $Loss_{SEM}$. The SEM loss may be calculated by Equation 2 below.

$$Loss_{SEM}=L1(SEM1,SEM2) \quad \text{[Equation 2]}$$

As defined by Equation 2, the SEM loss $Loss_{SEM}$ may be calculated as loss L1 between the first SEM image SEM1 and the second SEM image SEM2. However, the electronic device 100 or the GAN module 200 may calculate the SEM loss $Loss_{SEM}$ as any other loss, for example, loss L2 and/or a root mean square (RMS) loss, not loss L1.

In operation S230, the electronic device 100 and/or the GAN module 200 may calculate a SEG loss $Loss_{SEG}$. The SEG loss may be calculated by Equation 3 below.

$$Loss_{SEG}=L1(SEG1,SEG2) \quad \text{[Equation 3]}$$

As defined by Equation 3, the SEG loss $Loss_{SEG}$ may be calculated as loss L1 between the first SEG image SEG1 and the second SEG image SEG2. However, the electronic device 100 or the GAN module 200 may calculate the SEG loss $Loss_{SEG}$ as any other loss, for example, loss L2 and/or an RMS loss, not loss L1.

In operation S240, the electronic device 100 and/or the GAN module 200 may calculate a total loss "Loss". The total loss "Loss" may be calculated by Equation 4 below.

$$Loss=Loss_{GAN}+Loss_{SEM}+Loss_{SEG} \quad \text{[Equation 4]}$$

As defined by Equation 4, the total loss "Loss" may be calculated as a sum of the GAN loss $Loss_{GAN}$, the SEM loss $Loss_{SEM}$, and the SEG loss $Loss_{SEG}$. However, the electronic device 100 or the GAN module 200 may calculate the total loss "Loss" in any other form, for example, a weighted sum, not a sum of the GAN loss $Loss_{GAN}$, the SEM loss $Loss_{SEM}$, and the SEG loss $Loss_{SEG}$.

In operation S250, the electronic device 100 and/or the GAN module 200 may calculate a cost. For example, as described with reference to FIG. 2, when operation S110 to operation S140 are performed, one epoch may be performed. The total loss "Loss" may be calculated whenever the epoch is performed, that is, for each epoch. The electronic device 100 or the GAN module 200 may calculate an average of total losses of the epochs as the cost.

In operation S260, the electronic device 100 and/or the GAN module 200 may update the generation unit 210 and/or the discrimination unit 220 based on the total loss "Loss" and/or the cost. For example, the electronic device 100 and/or the GAN module 200 may update weights of the generation unit 210 and/or the discrimination unit 220 such that the total loss "Loss" and/or the cost decreases (or may perform learning on the weights).

In some example embodiments, the electronic device 100 and/or the GAN module 200 may alternately train the generation unit 210 and the discrimination unit 220. The electronic device 100 or the GAN module 200 may update (e.g., train) the generation unit 210 based on a total loss of at least one epoch or a loss from a first epoch to the last epoch. Afterwards, the electronic device 100 or the GAN module 200 may update (e.g., train) the discrimination unit 220 based on a total loss of at least another epoch or a loss from a first epoch to the last epoch.

Figure 8:
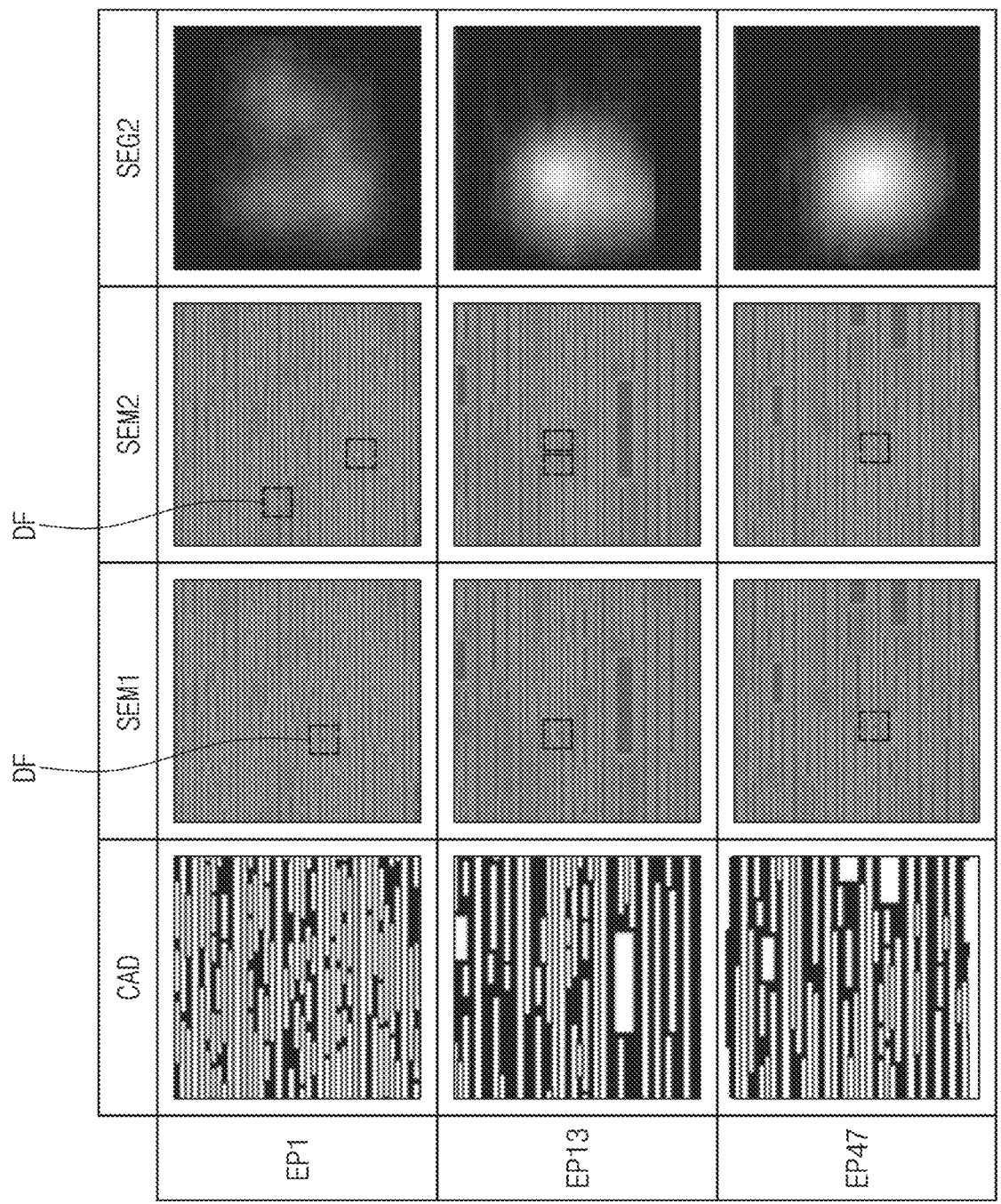
FIG. 8 illustrates an example in which a second SEG image generated by an electronic device or a GAN module is improved as the electronic device or the GAN module performs epochs.

FIG. 8 illustrates an example in which the second SEG image SEG2 generated by the electronic device 100 or the GAN module 200 is improved as the electronic device 100 or the GAN module 200 performs epochs. Referring to FIGS. 1, 2, 3, and 8, defects DF may be marked on the first SEM image SEM1 and the second SEM image SEM2.

In the first epoch EP1, locations marked in the second SEG image SEG2 that the electronic device 100 and/or the GAN module 200 generates may not be concentrated. As an epoch is repeated, as in the 13th epoch EP13 and the 47th epoch EP47, locations marked in the second SEG image SEG2 that the electronic device 100 and/or the GAN module 200 generates may be closer to locations of the actual defects DF, e.g. the actual defects of interest.

Figure 9:
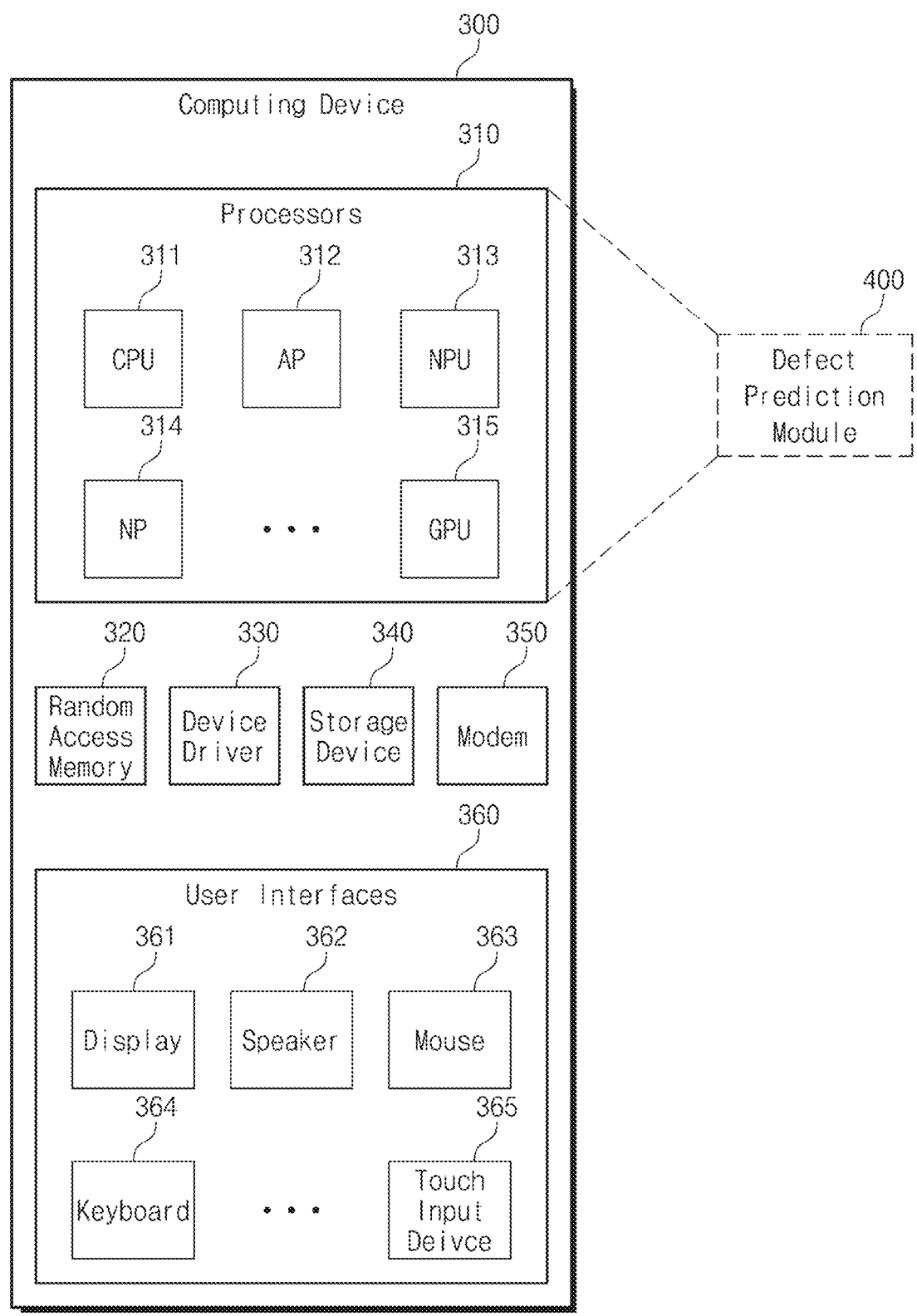
FIG. 9 is a block diagram illustrating an electronic device according to some example embodiments.

FIG. 9 is a block diagram illustrating an electronic device 300 according to some example embodiments. Referring to FIG. 9, the electronic device 300 may include processors 310, a random access memory 320, a device driver 330, a storage device 340, a modem 350, and user interfaces 360.

The processors 310 may include, for example, at least one general-purpose processor such as a central processing unit (CPU) 311 or an application processor (AP) 312. Also, the processors 310 may further include at least one special-purpose processor such as a neural processing unit (NPU) 313, a neuromorphic processor 314, or a graphics processing unit (GPU) 315. The processors 310 may include two or more homogeneous processors.

At least one (or at least another) of the processors 310 may execute a defect prediction module 400. The defect prediction module 400 may include the generation unit 210 of FIG. 3. For example, the defect prediction module 400 may predict a defect of a semiconductor device by generating the second SEM image SEM2 and the second SEG image SEG2 from the CAD image CAD. For example, the defect prediction module 400 may be implemented in the form of commands (and/or codes) that are executed by at least one of the processors 310. In this case, the at least one processor may load the commands (or codes) of the defect prediction module 400 onto the random access memory 320.

Alternatively or additionally, at least one (or at least another) processor of the processors 310 may be manufactured to implement the defect prediction module 400. For example, the at least one processor may be a dedicated processor that is implemented in hardware based on the defect prediction module 400 generated by the learning of the defect prediction module 400.

The random access memory 320 may be used as a working memory of the processors 310 and may be used as a main memory or a system memory of the electronic device 300. The random access memory 320 may include a volatile memory such as a dynamic random access memory and/or a static random access memory, and/or may include a nonvolatile memory such as one or more of a phase-change random access memory, a ferroelectric random access memory, a magnetic random access memory, or a resistive random access memory.

The device driver 330 may control the following peripheral devices depending on a request of the processors 310: the storage device 340, the modem 350, and the user interfaces 360. The storage device 340 may include a stationary storage device such as a hard disk drive or a solid state drive, or a removable storage device such as an external hard disk drive, an external solid state drive, or a removable memory card.

The modem 350 may provide remote communication with an external device. The modem 350 may perform wired or wireless communication with the external device. The modem 350 may communicate with the external device based on at least one of various communication schemes such as Ethernet, wireless-fidelity (Wi-Fi), long term evolution (LTE), and 5G mobile communication.

The user interfaces 360 may receive information from a user and may provide information to the user. The user interfaces 360 may include at least one user output interface such as a display 361 or a speaker 362, and at least one user input interface such as a mouse 363, a keyboard 364, or a touch input device 365.

The commands (and/or codes) of the defect prediction module 400 may be received through the modem 350 and may be stored in the storage device 340. The commands (or codes) of the defect prediction module 400 may be stored in a removable storage device, and the removable storage device may be connected with the electronic device 300. The commands (or codes) of the defect prediction module 400 may be loaded and executed onto the random access memory 320 from the storage device 340.

In some example embodiments, the defect prediction module 400 may be implemented based on a conditional GAN and/or a pixe2pix.

Figure 10:
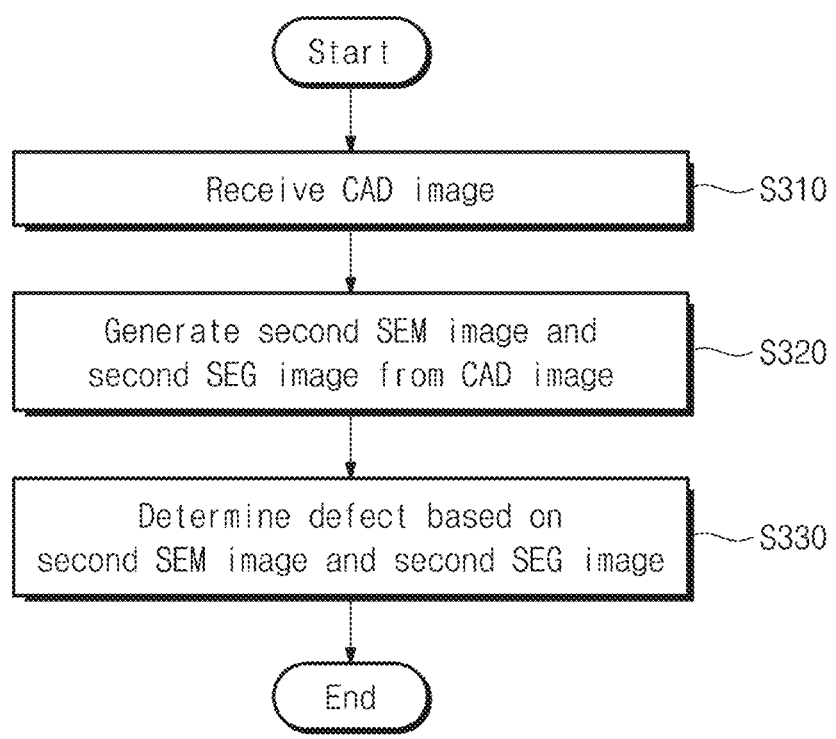
FIG. 10 illustrates an example of an operating method of an electronic device of FIG. 9.

FIG. 10 illustrates an example of an operating method of the electronic device 300 of FIG. 9. Referring to FIGS. 3, 9, and 10, in operation S310, the electronic device 300, for example, and/or the defect prediction circuit/module 400, may receive a computer aided design (CAD) image for a semiconductor process of a semiconductor device.

In operation S320, the electronic device 300, for example, and/or the defect prediction module 400, may generate a second SEM image SEM2 and a second SEG image SEG2 from the CAD image. The second SEM image SEM2 may be obtained from the CAD image as the defect prediction module 400 performs inference based on machine learning (e.g., GAN). The second SEG image SEG2 may also be obtained from the CAD image as the defect prediction module 400 performs inference based on machine learning (e.g., GAN).

In operation S330, the electronic device 300, for example, and/or the defect prediction module 400, may determine a defect based on the second SEM image SEM2 and the second SEG image SEG2. For example, as described with reference to FIG. 6, when a mark such as Gaussian blurring is present on the second SEG image SEG2, the electronic device 300, for example, and/or the defect prediction module 400 may determine that a defect is present at a location corresponding to the mark. When a mark such as Gaussian blurring is absent from the second SEG image SEG2, the electronic device 300, for example, and/or the defect prediction module 400 may determine that there is no defect.

Figure 11:
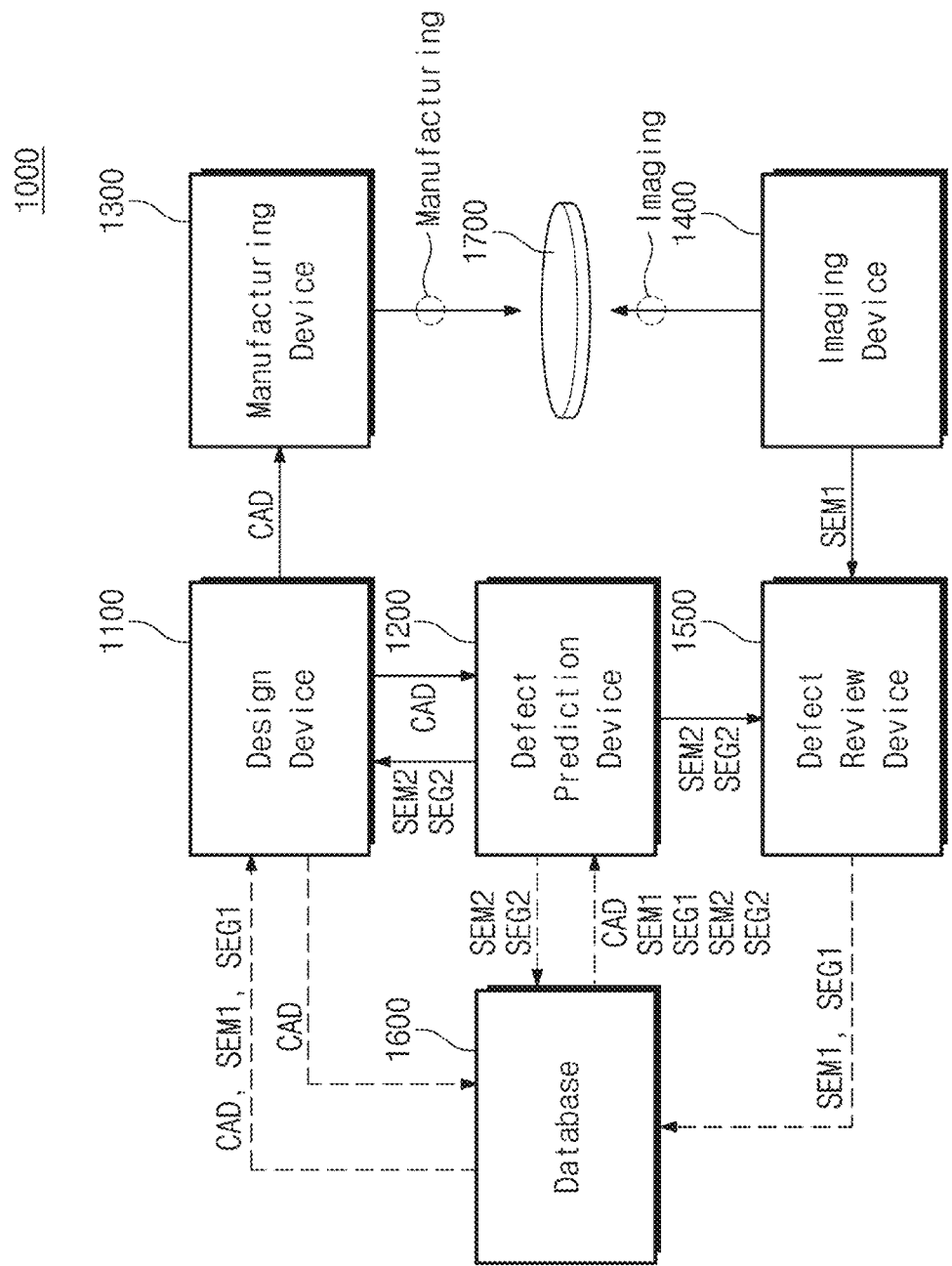
FIG. 11 illustrates an example of a semiconductor device manufacturing system 1000 according to some example embodiments.

FIG. 11 illustrates an example of a semiconductor device manufacturing system 1000 according to some example embodiments. Referring to FIG. 11, the semiconductor device manufacturing system 1000 may include a design device 1100, a defect prediction device 1200, a manufacturing device 1300, an imaging device 1400, a defect review device 1500, and database 1600.

The design device 1100, the defect prediction device 1200, the manufacturing device 1300, the imaging device 1400, the defect review device 1500, and the database 1600 may be implemented with at least one electronic device. Alternatively, each of the design device 1100, the defect prediction device 1200, the manufacturing device 1300, the imaging device 1400, the defect review device 1500, and the database 1600 may separately be implemented with at least one electronic device.

The design device 1100 may generate the CAD image CAD. The CAD image generated by the design device 1100 may be transferred to the defect prediction device 1200. The defect prediction device 1200 may correspond, for example, to the defect prediction module 400 of FIG. 9. The defect prediction device 1200 may generate the second SEM image SEM2 and the second SEG image SEG2 from the CAD image.

The second SEM image SEM2 and the second SEG image SEG2 generated by the defect prediction device 1200 may be used in a first follow-up operation. For example, the second SEM image SEM2 and the second SEG image SEG2 may be transferred to the design device 1100.

The design device 1100 may revise the CAD image CAD based on the second SEM image SEM2 and the second SEG image SEG2. For example, the design device 1100 may perform a "redesign-for-manufacturability" adjustment based on the second SEM image SEM2 and the second SEG image SEG2. The design device 1100 may again transfer the revised CAD image CAD to the defect prediction device 1200 and may again receive the second SEM image SEM2 and the second SEG image SEG2 from the defect prediction device 1200. When the CAD image CAD is determined, the design device 1100 may transfer the CAD image CAD to the manufacturing device 1300.

The manufacturing device 1300 may manufacture a semiconductor device 1700 based on the CAD image CAD. In some example embodiments, the semiconductor device 1700 may be implemented as one of a plurality of integrated circuits implemented on a semiconductor wafer.

The imaging device 1400 may photograph the semiconductor device 1700, e.g. with a scanning electron microscope (SEM) and/or an optical microscope, to generate the first SEM image SEM1. The defect review device 1500 may receive the first SEM image SEM1 from the imaging device 1400 and may perform a defect review of the semiconductor device 1700 based on the first SEM image SEM1.

The second SEM image SEM2 and the second SEG image SEG2 generated by the defect prediction device 1200 may be used in a second follow-up operation. For example, the defect review device 1500 may receive the second SEM image SEM2 and the second SEG image SEG2 corresponding to the determined CAD image CAD from the defect prediction device 1200. The defect review device 1500 may review defects of the first SEM image SEM1 with reference to locations of defects marked on the second SEM image SEM2 and/or the second SEG image SEG2. For example, the defect review device 1500 may generate the first SEG image SEG1 indicating locations of the detected defects.

The CAD image CAD determined by the design device 1100, the second SEM image SEM2 and the second SEG image SEG2 that are generated by the defect prediction device 1200 and correspond to the determined CAD image CAD, the first SEM image SEM1 generated by the imaging device 1400, and the first SEG image SEG1 that is generated by the defect review device 1500 and corresponds to the first SEM image SEM1 may be correlated with each other and may be stored in the database 1600.

The CAD image CAD, the first SEM image SEM1, and the first SEG image SEG1 may be used to improve (e.g., additionally train) the design device 1100. The CAD image CAD, the first SEM image SEM1, the first SEG image SEG1, the second SEM image SEM2, and the second SEG image SEG2 may be used to improve (e.g., additionally train) the defect prediction device 1200.

In some example embodiments, components according to the present disclosure are described by using the terms "first", "second", "third", etc. However, the terms "first", "second", "third", etc. may be used to distinguish components from each other and do not limit the present disclosure. For example, the terms "first", "second", "third", etc. do not involve an order or a numerical meaning of any form.

In some example embodiments, components according to embodiments of the present disclosure are referenced by using blocks. The blocks may be implemented with various hardware devices, such as an integrated circuit, an application specific IC (ASIC), a field programmable gate array (FPGA), and a complex programmable logic device (CPLD), firmware driven in hardware devices, software such as an application, or a combination of a hardware device and software. Also, the blocks may include circuits implemented with semiconductor elements in an integrated circuit, or circuits enrolled as an intellectual property (IP).

According to some example embodiments, a machine learning-based module is trained and driven based on a CAD image, a scanning electron microscope (SEM) image, and a segment (SEG) image. Accordingly, a method of a machine learning-based module predicting a defect of a semiconductor device with improved reliability with regard to manufacture of a semiconductor device, an electronic device driving the machine learning-based module, and/or an operating method of the electronic device are provided.

In some example embodiments, a method of fabricating a semiconductor device may be improved, with an improvement in the identification of and/or localization of various defects that may be present within a fabrication process. For example, by using a CAD image CAD in addition to a generated SEM image SEM2, defect localization may be improved, which may enable an improved semiconductor fabrication process.

Example embodiments are not necessarily mutually exclusive. For example, some example embodiments may include one or more features described with reference to one or more figures, and may also include one or more features described with reference to one or more other figures.

While various example embodiments have been described, it will be apparent to those of ordinary skill in the art that various changes and modifications may be made thereto without departing from the spirit and scope of example embodiments as set forth in the following claims.

What is claimed is:

1. An operating method of an electronic device for manufacture of a semiconductor device, the method comprising:
   receiving, at the electronic device, a computer-aided design (CAD) image for a lithography process of the semiconductor device;
   generating, at the electronic device, a first scanning electron microscope (SEM) image and a first segment (SEG) image, the first SEM image and the first SEG image generated from the CAD image by using a machine learning-based circuit,
   wherein the first SEG image includes information about a location of a defect;
   calculating, at the electronic device, a SEM loss based on the first SEM image and a SEG loss based on the first SEG image;
   calculating, at the electronic device, a cost based on the SEM loss and the SEG loss; and
   updating, at the electronic device, the machine learning-based circuit based on the cost.

2. The method of claim 1, further comprising:
   receiving, at the electronic device, a second SEM image and a second SEG image that correspond to the CAD image.

3. The method of claim 2, wherein the second SEM image and the second SEG image are obtained from a semiconductor device at least partially manufactured by using the CAD image.

4. The method of claim 2, further comprising:
   identifying, at the electronic device, one of a set of the CAD image, the first SEM image, and the first SEG image and a set of the CAD image, the second SEM image, and the second SEG image with a "true" label.

5. The method of claim 4, further comprising:
performing, at the electronic device, machine learning based on a result of the identifying.

6. The method of claim 2, further comprising:
calculating, at the electronic device, a generative adversarial network (GAN) loss;
wherein calculating, at the electronic device, the SEM loss is further based on the second SEM image; and
wherein calculating, at the electronic device, the SEG loss is further based on the second SEG image.

7. The method of claim 6, further comprising:
calculating, at the electronic device, a summed loss based on a sum of the GAN loss, the SEM loss, and the SEG loss;
wherein calculating, at the electronic device, the cost is based on the summed loss.

8. The method of claim 2, further comprising:
blending the CAD image, the first SEM image, and the first SEG image; and
blending the CAD image, the second SEM image, and the second SEG image.

9. The method of claim 2, further comprising:
generating a first set of three channels with the CAD image, the first SEM image, and the first SEG image; and
generating a second set of three channels with the CAD image, the second SEM image, and the second SEG image.

10. The method of claim 2, further comprising:
generating a first cascade image with the CAD image, the first SEM image, and the first SEG image; and
generating a second cascade image with the CAD image, the second SEM image, and the second SEG image.

11. The method of claim 1, wherein the machine learning-based circuit is based on one or both of a conditional GAN or a pixe2pixel.

12. The method of claim 1, wherein the first SEG image indicates the location of the defect in one or more of the shape of Gaussian blurring, pixels corresponding to the defect, a circle, or a quadrangle.

13. An electronic device comprising:
a memory; and
a processor configured to drive a machine learning-based circuit by using the memory,
wherein, in response to executing the machine learning-based circuit, the processor is configured to,
receive a computer-aided design (CAD) image for a lithography process of a semiconductor device,
generate a first scanning electron microscope (SEM) image and a first segment (SEG) image, the first SEM image and the first SEG image generated from the CAD image by using the machine learning-based circuit, wherein the first SEG image includes information about a location of a defect;
calculate a SEM loss based on the first SEM image and a SEG loss based on the first SEG image;
calculate a cost based on the SEM loss and the SEG loss; and
update the machine learning-based circuit based on the cost.

14. The electronic device of claim 13, wherein the processor is configured to further receive a second SEM image and a second SEG image that correspond to the CAD image, and
the second SEM image and the second SEG image are obtained from a semiconductor device at least partially manufactured by using the CAD image.

15. The electronic device of claim 14, wherein the processor is configured to identify one of a set of the CAD image, the first SEM image, and the first SEG image and a set of the CAD image, the second SEM image, and the second SEG image as a "true" label.

16. The electronic device of claim 14, wherein the processor is configured to calculate a GAN loss, wherein calculating the SEM loss is further based on the second SEM image, and wherein calculating SEG loss is further based on the second SEG image.

17. The electronic device of claim 16, wherein the processor is configured to update the machine learning-based circuit based on the GAN loss, the SEM loss, and the SEG loss.

18. A method of manufacturing a semiconductor device by using at least one electronic device, the method comprising:
receiving, at the at least one electronic device, a computer-aided design (CAD) image for a lithography process of the semiconductor device;
generating, at the at least one electronic device, a scanning-electron microscope (SEM) image and a segment SEG image from the CAD image, the SEM image and the SEG image generated by using a machine learning-based circuit;
performing, at the at least one electronic device, a follow-up operation based on the SEM image and the SEG image, wherein the SEG image includes information about a location of a defect;
calculating, at the at least one electronic device, a SEM loss based on the SEM image and a SEG loss based on the SEG image;
calculating, at the at least one electronic device, a cost based on the SEM loss and the SEG loss; and
updating, at the at least one electronic device, the machine learning-based circuit based on the cost.

19. The method of claim 18, wherein the performing of the follow-up operation includes:
revising the CAD image based on the SEM image and the SEG image.

20. The method of claim 18, wherein the performing of the follow-up operation includes:
at least partially manufacturing the semiconductor device based on the CAD image; and
inspecting a defect of the semiconductor device based on the SEM image and the SEG image.

* * * * *